United States Patent [19]

Stolfa

[11] Patent Number: 5,361,001
[45] Date of Patent: Nov. 1, 1994

[54] CIRCUIT AND METHOD OF PREVIEWING ANALOG TRIMMING

[75] Inventor: David L. Stolfa, Phoenix, Ariz.

[73] Assignee: Motorola, Inc., Schaumburg, Ill.

[21] Appl. No.: 160,762

[22] Filed: Dec. 3, 1993

[51] Int. Cl.$^5$ ............................ H03K 3/01; H03B 1/04
[52] U.S. Cl. .................................... 327/530; 327/525; 327/312
[58] Field of Search ................... 307/202.1, 296.1, 547, 307/548

[56] References Cited

U.S. PATENT DOCUMENTS 4,158,786  6/1979  Hirasawa .......................... 307/296.1
4,446,534  5/1984  Smith ................................ 307/202.1

FOREIGN PATENT DOCUMENTS 0112298  5/1987  Japan ................................ 307/202.1
0262716  10/1990  Japan ................................ 307/202.1

Primary Examiner—Margaret Rose Wambach
Attorney, Agent, or Firm—Robert D. Atkins

[57] ABSTRACT

An analog trim circuit enables and disables one or more serially connected passive elements for setting characteristics of the circuit. Each passive element has a transistor across its first and second conduction terminals operating in response to a control signal from a control circuit for enabling and disabling conduction through the associated passive element. The control circuits are responsive to a data signal for providing the control signals that enable and disable the conduction through the passive elements. The data signal allows a preview of the trimming results. The fuse in certain ones of the control circuits are blown to set the control signals to fixed values after removal of the data signal.

7 Claims, 1 Drawing Sheet

CIRCUIT AND METHOD OF PREVIEWING ANALOG TRIMMING

BACKGROUND OF THE INVENTION

The present invention relates in general to analog trim circuits and, more particularly, to a technique of previewing the analog trim results before blowing a fuse to lock the trim in place.

In manufacturing analog integrated circuits, the basic building blocks are usually not accurately controlled by the manufacturing process as may be desired. For example, capacitors and resistors may have the wrong value, and MOS transistors may have the wrong gain setting. There are too many variables in the manufacturing process to yield absolute predictable results. Yet historically analog circuits often require very accurate voltage references, frequency references, and accurately ratioed elements.

To compensate for the process variability, many electronic circuits use analog trimming during test to set resistor values as necessary for proper operation of the circuit. A typical trimming technique utilizes a resistor ladder comprising a series of serially coupled resistors each in parallel with either a fuse or anti-fuse. A fuse is a device that is substantially an electrical short until it is blown open. An anti-fuse is an electrical open until blown when it becomes substantially an electrical short.

The fuse-blowing approach may take several forms, each with its own shortcomings. Laser fuses may be used directly across each resistor element in the ladder to enable and disable conduction through the resistor. During test, certain resistors are selected to open the shunt element thereby adding resistance to the serial path. The resistor ladder should be adjustable at wafer test over a range from say 10 to 2,560 ohms in 10 ohm increments.

The analog trimming may be performed iteratively, i.e. test, trim, test, trim, to measure the effect of the course trim and determine the necessary fine trimming. For iterative trimming, a laser trim system is typically installed on the wafer tester to alternately test and trim. However, one laser system per tester is very expensive. The laser is often in an idle state waiting for the tester. Moreover, if either the test system or laser breaks down both are inoperative.

An alternate approach is to use a zener anti-fuse across the resistor ladder. Such an element can be cheaply trimmed on the tester so that iterative testing can be done in one pass on the tester. Zener anti-fuses require large currents to program. Therefore, each anti-fuse requires its own external pad and probe card needle. This restricts the programming bit count to say 5-10 bits before the die area for test pads and complexity of the probe card requirements become prohibitive.

In general, iterative testing is a slow and expensive process. Consequently, many trimming techniques utilize only a single pass to evaluate which resistors in the serial string should be included to achieve the desired analog circuit operation. Thus, as result of a test measurement, the user blows the shunt fuse elements whereby the circuit is expected to operate as planned. The process of blowing the fuses typically involves laser trimming off-line from the test set to cut the poly material and open the shunt element. The circuit may be returned to the test set to verify proper trimming. If the subsequent testing should fail, the part is typically discarded since it is difficult to patch the shunt fuse elements.

Hence, a need exists for an iterative trimming to evaluate the results of test before permanently setting the trim.

DETAILED DESCRIPTION OF THE PREFERRED EMBODIMENT

Figure 1:
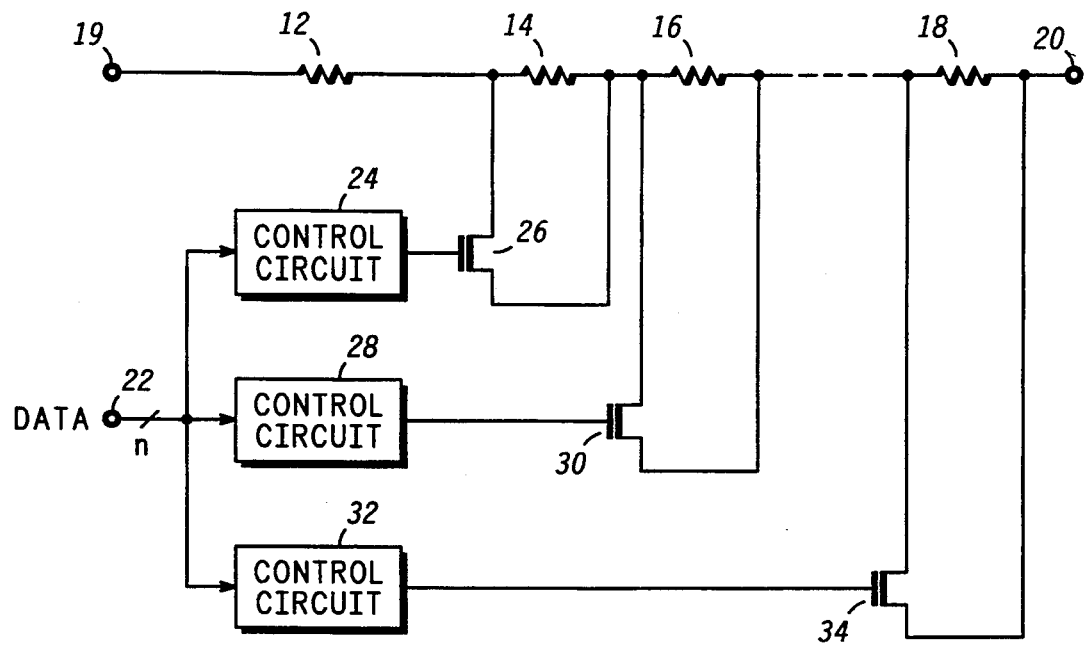
FIG. 1 is a block diagram illustrating an analog trimming circuit.

An analog trim circuit is shown in FIG. 1 including a passive ladder network 10 comprising resistors 12, 14, 16 and 18 serially coupled between terminal 19 and terminal 20. Resistor 12 is non-trimmable and provides the minimum ladder resistance ($R_{MIN}$). Resistors 14-18 are selected in an exponential series, such as 1280, 640, 320, 160, 80, 40, 20, and 10 ohms. Resistors 14-18 are passive elements each with first and second conduction terminals. Other passive elements may also be used in the trim circuit. A data signal is applied at terminal 22. One bit of the data signal is applied to each of control circuits 20, 28 and 32. An address signal selects the control circuit to latch one bit of the data signal.

Control circuit 24 provides a control signal to the gate of MOS transistor 26. The drain and source of transistor 26 are coupled to first and second conduction terminals of resistor 14. Likewise, control circuit 28 provides a control signal to the gate of MOS transistor 30 which has its drain and source coupled across resistor 16. Control circuit 32 provides a control signal to the gate of MOS transistor 34. The drain and source of transistor 34 are coupled across the first and second conduction terminals of resistor 18. The effective resistance through resistor ladder 10 is thus temporarily set by transistors 26, 30 and 34 selectively enabling and disabling conduction through resistors 14-18 upon receiving a high state or low state of control signals from control circuits 24, 28 and 32. With the above trimming scheme, the resistor ladder is controllable from $R_{MIN}$ to $R_{MIN}+2,560$ ohms assuming eight trimmable resistors in 256 possible 10 ohm increments.

Figure 2:
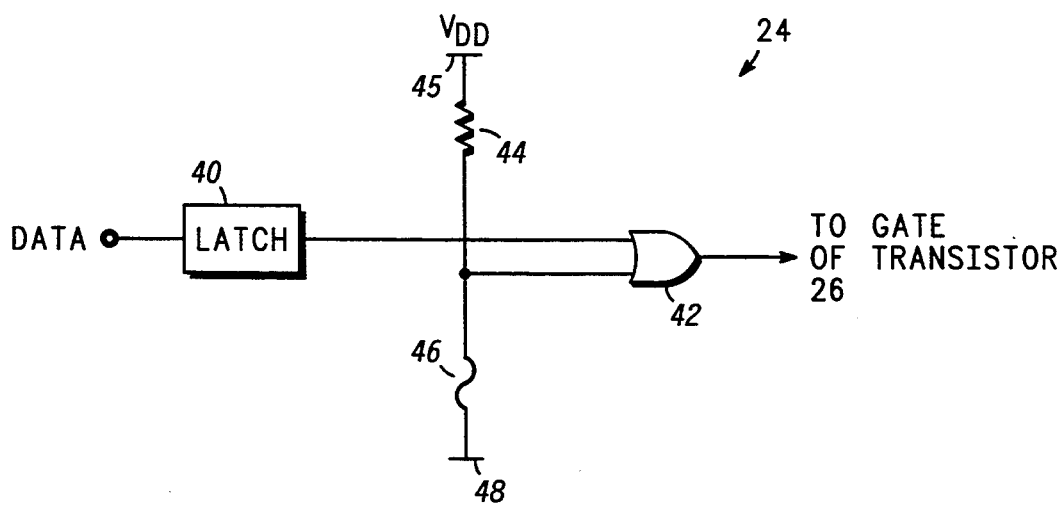
FIG. 2 is a schematic diagram illustrating the control circuit of FIG. 1.

Turning to FIG. 2, further detail of control circuit 24 is shown. Control circuits 28 and 32 follow a similar construction and operation as described for control circuit 24. The data signal is latched in latching circuit 40 for application to a first input of OR gate 42. An address signal enables latching circuit 40 to latch the data bit. Resistor 44 is coupled between the second input of OR gate 42 and power supply conductor 45. Power supply conductor 45 operates at a positive potential VDD such as 5 volts. Fuse 46 is coupled between the second input of OR gate 42 and power supply conductor 48 operating at ground potential. The output of OR gate 42 provides the control signal to the gate of transistor 26. An alternate embodiment of control circuit 24 may replace OR gate 42 with a NAND gate while resistor 44 and fuse 46 exchange places in the circuit.

Trim circuits are used in a variety of applications. For example, a circuit may require a given frequency $f_o$ determined by an RC time constant such that the frequency is inversely proportional to RC. The resistance R and capacitance C should be selected such that the nominal process target values of sheet $\rho$ (resistance per unit area) and capacitance per unit area yield the desired frequency $f_o$. However, the actual process values of resistance and capacitance may vary by 5%–10%. Thus, the trimmable resistor ladder 10 must be trimmed to compensate for any variation in sheet $\rho$ and capacitance per unit area.

During testing at wafer level, the circuit under test is exercised and any correction necessary to resistor ladder 10 is calculated by a binary search. Steps are taken to determine whether a resistor should be trimmed such that it is in the upper half or lower half of its trimmable range, i.e. determining if the most significant bit or largest resistor should be shorted or left to remain in resistor ladder 10. With resistor ladder 10 trimmed to its most significant bit the circuit under test is again tested and a correction is calculated to determine if it should be trimmed to the upper half or lower half of the remaining trimmable range. As a result, the next most significant resistor is shorted or allowed to remain. The process continues until all trimmable resistors have been checked.

Consider the trimming operation during test where a logic one data signal is stored in latching circuit 40 of each of control circuits 24, 28 and 32. The output of each OR gate 42 goes high and enables transistors 26, 30 and 34. Resistors 14–18 are substantially shorted, i.e. disabling the conduction path through resistors 14–18. The resistance of ladder 10 is equal to $R_{MIN}$.

To perform trim preview during test, the data signal to control circuit 24 is set to logic zero and stored in its latching circuit 40. At wafer test all fuses are yet unblown so that all fuse inputs to the OR-gates are low. The control signal at the output of OR-gate 42 goes low and turns off transistor 26 to enable the conduction through resistor 14. The resistance of ladder 10 increases to $R_{MIN}+R_{14}$, where $R_{14}$ is the value of resistor 14. The effect of the added resistance on the operation of the circuit under test may be checked and verified by the tester. If more resistance is needed, the data signal to control circuit 28 may be set to logic zero. The control signal to transistor 30 goes low as described above for control circuit 24. Transistor 30 turns off and enables the conduction through resistor 16. The resistance of ladder 10 increases to $R_{MIN}+R_{14}+R_{16}$, where $R_{16}$ is the value of resistor 16. Again, the effect of the added resistance on the operation of the circuit under test may be checked and verified by the tester. The process continues until the circuit under test operates as desired. Note at this point, the trimming process is temporary and dependent on the data signals to control circuits 24, 28 and 32. No fuses have yet been blown to lock in the trim. Thus, different combinations of resistors 14–18 may be previewed and checked to achieve optimal results.

An alternate trim approach could initially set the data signals to logic zero in control circuits 24, 28 and 32. The output of each OR gate 42 goes low and disables transistors 26, 30 and 34. The shunt elements 26, 30 and 34 are substantially opened, i.e. enabling conduction through resistors 14–18, thereby making ladder 10 resistance maximum. The testing preview involves setting the data signals to logic one and iteratively enabling transistors 26, 30 and 34 to disable conduction through resistors 14–18 and reduce resistance in ladder 10. The process continues until the circuit under test operates as desired. Again, the trimming process is temporary and dependent on the data signals to control circuits 24, 28 and 32. No fuses have yet been blown to lock in the trim. Different combinations of resistors 14–18 may be tried and checked to achieve optimal results.

Another embodiment of the present invention is to configure the resistor ladder with the resistors in parallel and the control transistors in series with each resistor.

For the circuits under test that functionally pass, the bit pattern of trim is recorded in a file by wafer and die site. The file accompanies the wafer to a laser fuse system where the selected fuses 46 are blown. Once the appropriate fuses are blown, the latches in the control circuits are set to logic zero so that the state of the fuses alone determines the state of the control signal and therefore the permanent trim. The control signals from control circuits 24, 28 and 32 are thus set to a fixed value by blowing the selected fuses 46 in the control circuits after removal of the data signal at terminal 22.

The fuses are generally doped polycrystalline silicon films sometimes silicided polycrystalline silicon films in the range of 10 to 500 ohms. The polysilicon film is usually made in the shape of a polysilicon resistor with a width five to ten times its length. The ends of the fuses are connected by metal interconnects to the relevant circuitry. The fuse usually has most or all overlying oxide layers removed. With the use of on-die alignment marks the laser beam of approximately 1 $\mu$m–2 $\mu$m beam width is focused on the center of the fuse. The laser beam is a pulsed signal of such an energy that the polysilicon is vaporized and the fuse is severed and therefore permanently no longer conductive.

A key feature of the present invention is to preview trimming at wafer test to provide an economical means of iteratively trimming the resistive ladder using data provided by the tester. A data signal selectively trims the resistor ladder. The trimming is temporary and may be modified with different data signals to achieve optimal results. When the proper pattern of trim bits is determined for each individual circuit under test, that data is recorded and transferred off-line to the laser trimmer along with the wafer. The laser trim system blows the appropriate fuses for each circuit under test according to the pattern previously determined by testing various trimming options. Once the appropriate fuses are blown, the latches in the control circuits are set to logic zero so that the state of the fuses alone determines the state of the control signal and therefore sets the permanent trim. The preview trimming process allows optimization of the bit pattern for trimming before the actual laser trimming. Furthermore, the testing and the fusing systems may remain separate without requiring multiple passes through each.

While specific embodiments of the present invention have been shown and described, further modifications and improvements will occur to those skilled in the art. It is understood that the invention is not limited to the particular forms shown and it is intended for the appended claims to cover all modifications which do not depart from the spirit and scope of this invention.

I claim:

1. An analog trim circuit, comprising:
    a passive element having first and second conduction terminals;
    first means coupled across said passive element and operating in response to a control signal for enabling and disabling conduction through said passive element, said first means includes a transistor having a gate, a drain and a source, said drain being coupled to said first conduction terminal, said source being coupled to said second conduction terminal, said gate being coupled for receiving said control signal; and second means responsive to a data signal for providing said control signal to said first means to enable and disable said conduction through said passive element, said second means setting said control signal to a fixed value after removal of said data signal.

2. The analog trim circuit of claim 1 wherein said passive element includes a first resistor coupled between said first and second conduction terminals.

3. The analog trim circuit of claim 2 wherein said second means includes:
- a latching circuit having an input coupled for receiving said data signal and having an output;
- a logic gate having first and second inputs and an output, said first input being coupled to said output of said latching circuit, said output being coupled for providing said control signal;
- a second resistor coupled between a first power supply conductor and said second input of said logic gate; and
- a fuse coupled between said second input of said logic gate and a second power supply conductor.

4. A method of analog trimming, comprising the steps of:
- enabling conduction through a passive element in response to a first state of a control signal;
- disabling conduction through said passive element in response to a second state of said control signal;
- activating said control signal in response to a data signal to enable and disable said conduction through said passive element, said activating step including the steps
  - (a) latching said data signal, and
  - (b) logically combining said data signal with a logic signal for providing said control signal; and
- setting said control signal to a fixed value after removal of said data signal.

5. The method of claim 4 wherein said setting step includes the steps of:
- removing said data signal; and
- blowing a fuse to set said control signal at said fixed value.

6. An analog trim circuit, comprising:
- a passive element having first and second conduction terminals;
- a transistor having a gate, a drain and a source, said drain being coupled to said first conduction terminal, said source being coupled to said second conduction terminal, said gate being coupled for receiving a control signal;
- a latching circuit having an input coupled for receiving a data signal and having an output;
- a logic gate having first and second inputs and an output, said first input being coupled to said output of said latching circuit, said output being coupled for providing said control signal;
- a first resistor coupled between a first power supply conductor and said second input of said logic gate; and
- a fuse coupled between said second input of said logic gate and a second power supply conductor.

7. The analog trim circuit of claim 6 wherein said passive element includes a first resistor coupled between said first and second conduction terminals.

* * * * *